US006495455B2

(12) United States Patent
Vassalli et al.

(10) Patent No.: US 6,495,455 B2
(45) Date of Patent: Dec. 17, 2002

(54) METHOD FOR ENHANCING SELECTIVITY BETWEEN A FILM OF A LIGHT-SENSITIVE MATERIAL AND A LAYER TO BE ETCHED IN ELECTRONIC SEMICONDUCTOR DEVICE FABRICATION PROCESSES

(75) Inventors: Omar Vassalli, Pradalunga (IT); Simone Alba, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/836,937

(22) Filed: Apr. 17, 2001

(65) Prior Publication Data

US 2002/0008305 A1 Jan. 24, 2002

Related U.S. Application Data

(62) Division of application No. 09/342,318, filed on Jun. 29, 1999, now abandoned.

(30) Foreign Application Priority Data

Jun. 30, 1998 (IT) .......................................... MI98A1494

(51) Int. Cl.[7] .............................................. H01L 21/44
(52) U.S. Cl. ........................ 438/669; 438/705; 438/798
(58) Field of Search ................................. 438/669, 705, 438/798

(56) References Cited

U.S. PATENT DOCUMENTS

| 4,068,018 | A |   | 1/1978  | Hashimoto et al. ............ 427/38 |
|-----------|---|---|---------|-------------------------------------|
| 4,468,284 | A | * | 8/1984  | Nelson ......................... 156/643 |
| 5,679,499 | A | * | 10/1997 | Yamamori .................... 430/313 |
| 5,858,879 | A | * | 1/1999  | Chao et al. .................. 438/725 |
| 5,994,225 | A |   | 11/1999 | Liu et al. ..................... 438/694 |
| 6,121,154 | A | * | 9/2000  | Haselden et al. ............ 438/724 |
| 6,271,154 | B1| * | 8/2001  | Shen et al. .................. 438/942 |

* cited by examiner

Primary Examiner—T. N. Quach
(74) Attorney, Agent, or Firm—Lisa K. Jorgenson; E. Russell Tarleton; SEED IP Law Group PLLC

(57) ABSTRACT

A method enhances selectivity between a film of a light-sensitive material and a layer to be subjected to etching in the course of fabrication processes of an electronic semiconductor device starting from a semiconductor material wafer. The method includes radiating the wafer with an ion beam subsequently to depositing the layer to be etched and defining a circuit pattern on the film of light-sensitive material. An alternative method exposes the wafer to a non-reactive gas medium under plasma rather than radiating the wafer with an ion beam.

8 Claims, 5 Drawing Sheets

METHOD FOR ENHANCING SELECTIVITY BETWEEN A FILM OF A LIGHT-SENSITIVE MATERIAL AND A LAYER TO BE ETCHED IN ELECTRONIC SEMICONDUCTOR DEVICE FABRICATION PROCESSES

This application is a Divisional of U.S. patent application No. Ser. 09/342,318, filed Jun. 29, 1999, abandoned.

TECHNICAL FIELD

This invention relates to a method for enhancing selectivity between a film of a light-sensitive material and a layer to be subjected to etching in the course of electronic semiconductor device fabrication processes.

BACKGROUND OF THE INVENTION

As is well known, the fabrication of electronic semiconductor devices involves subjecting wafers of a silicon semiconductor to a number of chemio-physical treatments in order to define complex patterns of monolithically integrated electronic circuits thereon.

Specifically for defining submicron geometries, a processing technique known as plasma etching is used extensively whereby thin films of both conductive and dielectric materials can be etched.

For example, FIG. 1a shows schematically a portion of a semiconductor substrate 1 on which has been deposited a layer or film 2 of a suitable material for plasma etching, which film may be a dielectric layer, a layer of polycrystalline silicon, or a metallization layer.

FIG. 1b shows schematically the same semiconductor portion as overlaid with a layer 3 of a light-sensitive material, e.g., a photoresist.

As is well known, to define patterns in the underlying layer 2, the photoresist must be subjected to a photolithographic process for hardening predetermined portions 4 of the photoresist. A subsequent flushing step will result in the uncured photoresist portions being removed to leave the portions 4 as masks for corresponding portions of the layer 2 underneath, as shown in FIG. 1c.

At this point, a selective plasma etching step allows the patterns defined in the photoresist layer 3 to be transferred onto the layer 2. The masks represented by the cured photoresist portions 4 will protect the layer 2 during the etching step, as shown in FIG. 1d.

Finally, the photoresist masks are removed to reveal the structure shown in FIG. 1e.

One of the most important features of plasma etch processing is etch selectivity between the photoresist and the layer 2 to be etched. Briefly stated, the etching rate ratio of the two layers is vital to a successful etching operation.

The problems involved in providing for a high etch selectivity are discussed in U.S. Pat. No. 5,277,757, for example.

The selectivity values to be obtained by current technologies usually lie within the range of 2 to 15.

With too low a selectivity, the photoresist may become exhausted before the layer 2 being processed is fully etched. Thus, if the etching were continued, the upper portion of the layer 2 would no longer be protected by the photoresist, and would be etched itself. The outcome of this is an unacceptable degradation of the patterns, leading to possible losses in the yield of approved devices for operation.

To clarify the above points, attention is directed to FIGS. 2a and 2b, which reproduce photographs taken at an electron microscope of two identical profiles of aluminum metal interconnects. FIG. 2a shows a profile wherein etch selectivity has been adequate to ensure that the etched layer could take a desired shape with a rectangular cross-section.

Conversely, FIG. 2b shows a profile wherein etch selectivity has been inadequate to provide the desired shape for the etched layer; in fact, a degradation of the top surface is clearly noticeable.

With the current trend of integrated circuit fabrication technology towards defining ever smaller geometric structures, which involves lithographic constraints in terms of focal depth (Deep UV), it becomes necessary to use photoresist layers of ever smaller thickness.

Such thin layers are inherently less resistant to etching processes, and result in even lower selectivity.

In summary, there exists a growing demand for new technologies effective to enhance selectivity during etching processes.

A prior attempt at filling this demand has been a technology known as "photostabilization". It provides for exposure of the semiconductor material wafers to high-intensity UV radiation at an elevated temperature, about 200° C.

This treatment is described in a publication "The Platform for Excellence for Photoresist Processing", GEMINI, and is carried out after the layer 2 to be etched has been deposited and the photoresist patterned for plasma etching. Accordingly, the wafer 1 would be photostabilized after the step of FIG. 1c and ahead of the step of FIG. 1d.

Photostabilization causes the characteristics of the resin comprising the photoresist to undergo modification, and produces cross-linking reactions between the polymer chains. This provides increased resistance to plasma etch processing.

While being advantageous in more than one way, this prior technique concurrently causes the photoresist to become more dense, which if carried too far can result in the post-etch dimensions being excessively small and unacceptable. This same problem has also been encountered where a photoresist of the Deep UV type was used.

In addition, the photostabilization technique requires the availability of special equipment.

A second prior technique consists of radiating the wafer with an electron beam. This technique is described, for example, by M. Ross et al. in a publication "Characterization of Electron Beam Stabilization of Deep-UV Resist", Proceedings of the Microlithography Seminar INTERFACE 1997, page 119.

This radiation step is also carried out after the step of FIG. 1c and before the step of FIG. 1d.

An electron source is used for the purpose, with the electrons being accelerated towards the wafer surface by means of an electron gun.

The last-mentioned technique has the same advantages and the same drawbacks as that previously discussed.

A further approach is described in Japanese Patent Specification No. JP-01 288853, which relates to a semiconductor wafer processing technique using a reactive gas, such as $CF_4$.

In this way, an additional barrier layer is created over the photoresist.

SUMMARY OF THE INVENTION

An embodiment of the present invention provides a method for enhancing selectivity between a film of a light-sensitive material and a layer to be etched in processes for fabricating electronic semiconductor devices. The method has such functional features as to effectively improve selectivity without introducing additional steps in the process.

The embodiment provides a method as above which can be implemented without the use of special equipment.

In one embodiment, the method radiates the wafer of semiconductor material with an ion beam.

Another embodiment provides for the wafer of semiconductor material to be exposed to a chemically inert plasma medium, that is a medium comprising non-reactive noble gases.

The features and advantages of the invention will be apparent from the following description of an exemplary, though not limitative, embodiment thereof illustrated by the accompanying drawings.

DETAILED DESCRIPTION

A first embodiment of this invention provides a method for enhancing selectivity between a film of a light-sensitive material and a layer to be etched, in all processes for fabricating electronic semiconductor devices starting from wafers of semiconductor material.

In particular, the method provides for the wafers to be radiated with an ion beam.

The exposure to the radiation takes place in an ion implantation apparatus.

However, it would be equally possible to provide a separate apparatus specially for exposing the wafers of semiconductor material to radiation.

Figure 3A:
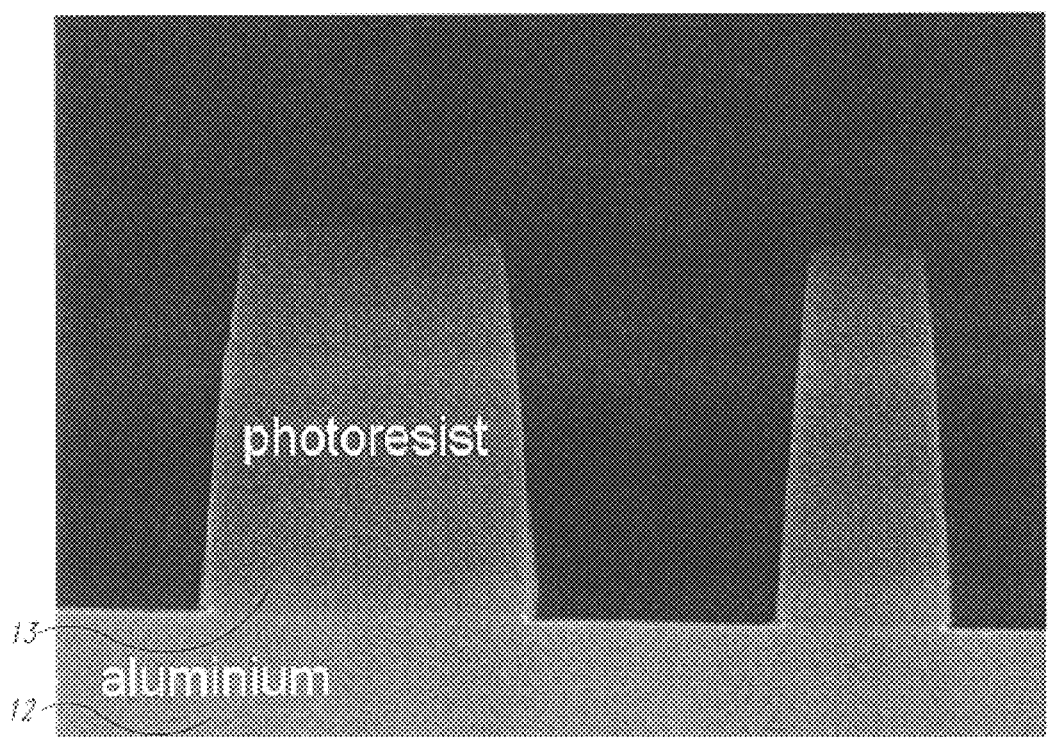
FIGS. 3a and 3b are respective photographs at the electron microscope showing a detail of a conventional semiconductor device, as formed on a semiconductor material wafer processed according to the art.
Figure 3B:
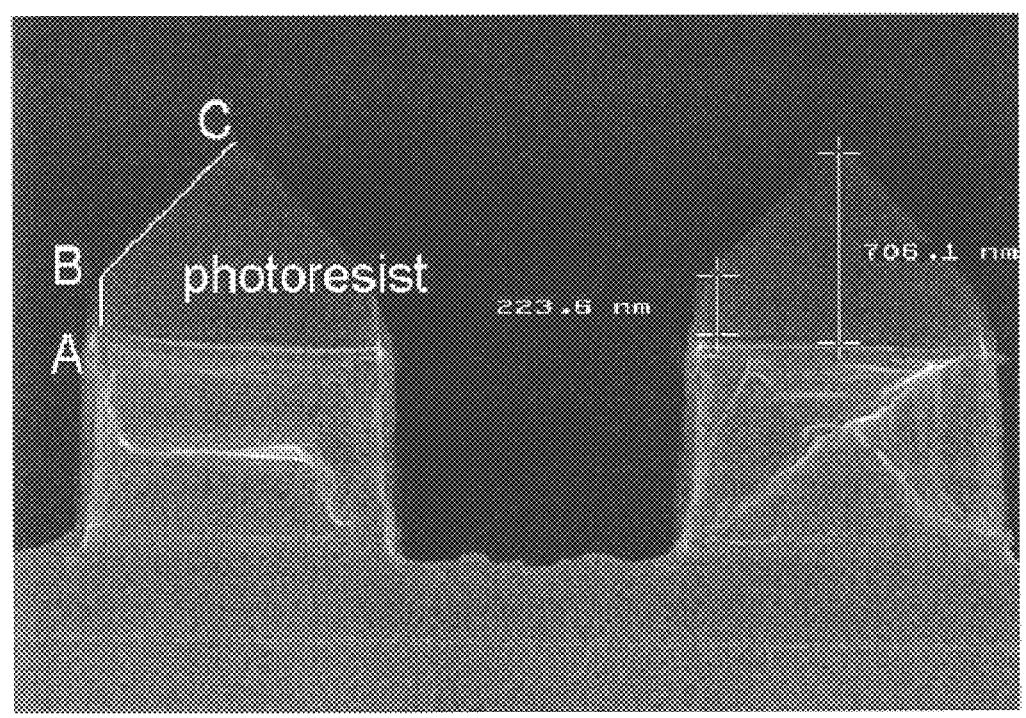

Referring to FIGS. 3a and 3b, the results obtained by applying the inventive method to an electronic semiconductor device incorporating interconnect tracks of aluminum are reported herein below. These tracks are to be regarded as comprising a layer 12 intended for plasma etching.

In FIG. 3a, the profile of the photoresist layer 13 before the etching step can be observed. This profile shows to be almost vertical.

FIG. 3b shows an aluminum track in cross-section, after the etching step and with no particular treatments having been applied to the semiconductor material wafer. The amount of photoresist left over the aluminum layer 12 can also be seen.

The photoresist profile can be represented schematically by a folded line comprising a first, vertical segment a-b and a second, sloping segment b-c.

The slope of the second segment b-c is due to depletion of the photoresist during the plasma etching step.

Figure 1A:
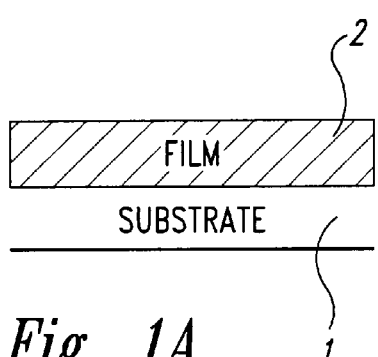
FIGS. 1a to 1e are respective vertical cross-section views showing schematically a semiconductor portion whereon a circuit is patterned in a manner known per se.
Figure 1B:
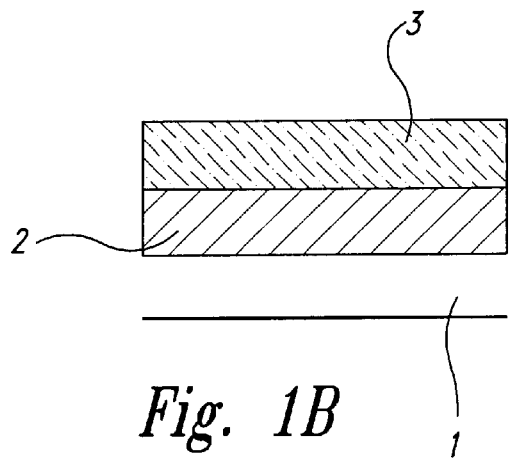
Figure 1C:
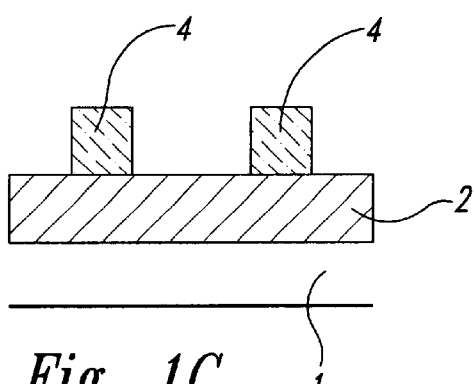
Figure 1D:
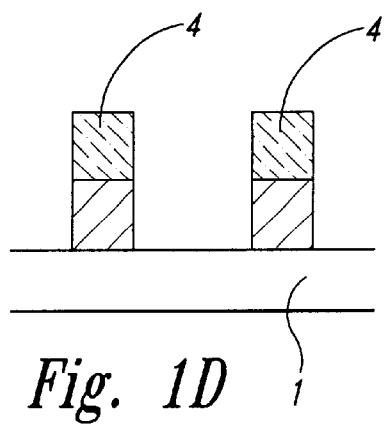
Figure 1E:
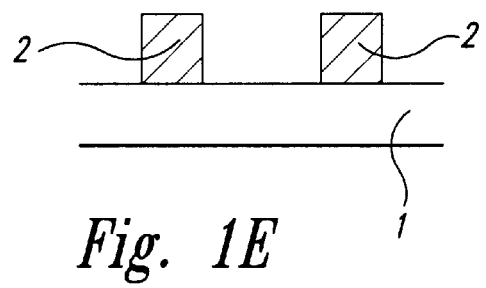
Figure 2A:
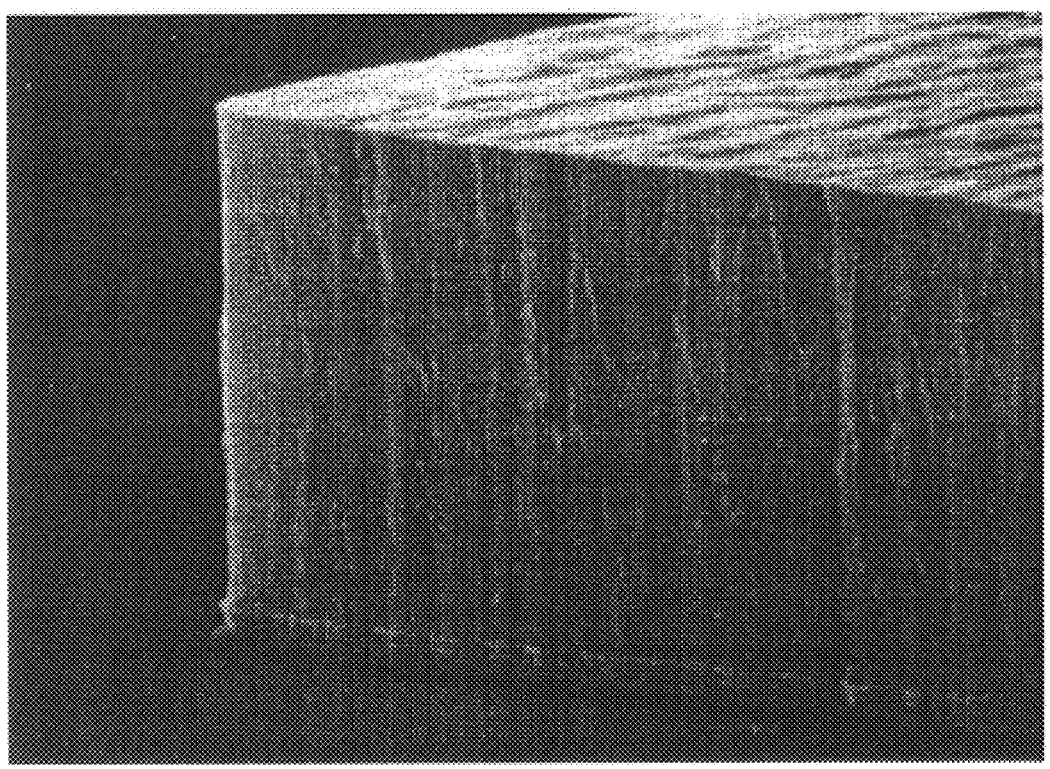
FIGS. 2a and 2b are respective photographs at the electron microscope showing a detail of a portion of a semiconductor device plasma etch processed in a manner known per se.
Figure 2B:
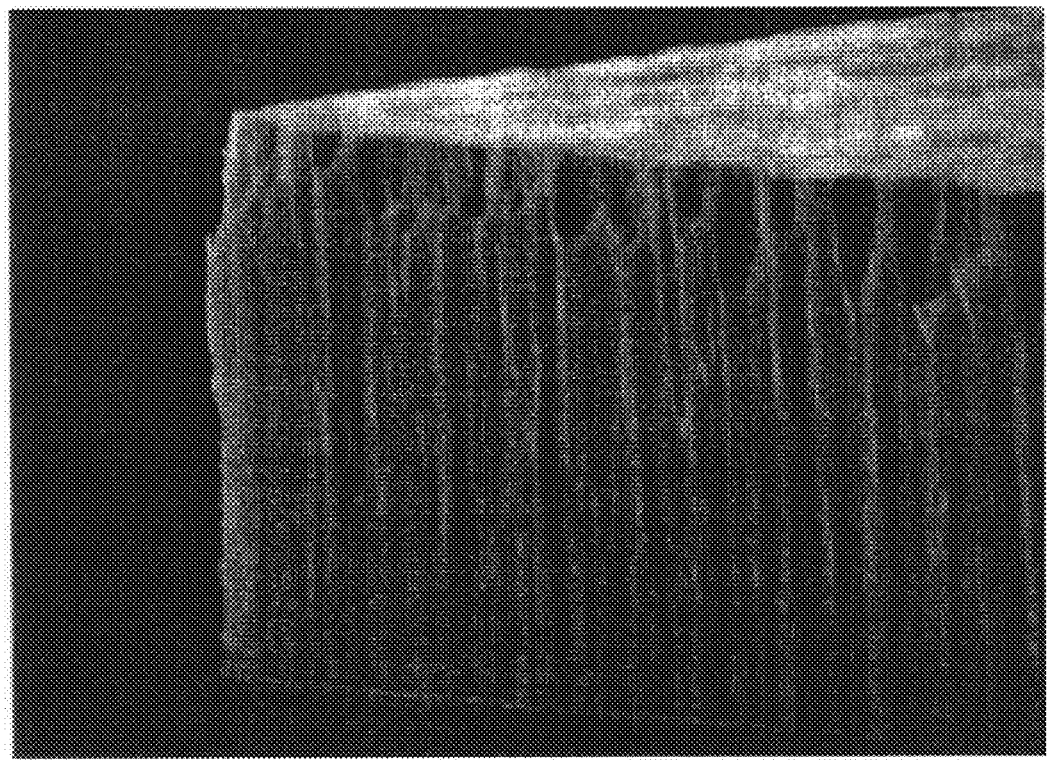

Should the etching step be carried further on, the first segment a-b would become shorter, down to a limiting condition of zero length. In such a condition, the profile of the photoresist would take a triangular form, and continued etching would result in the track profile shape deteriorating towards that shown in FIG. 2b.

An extended etching step may be occasioned by the need to remove possible residues from critical areas of the semiconductor material wafer.

Thus, the situation illustrated by FIG. 3b may be taken to be critical, and a higher selectivity would undoubtedly be desirable.

Furthermore, to produce submicron circuit patterns, it is necessary to use photoresist of smaller thickness. In particular, a reduction in thickness of about 2200 angstroms, equal to the segment a-b, would lead to a critical situation.

Figure 4A:
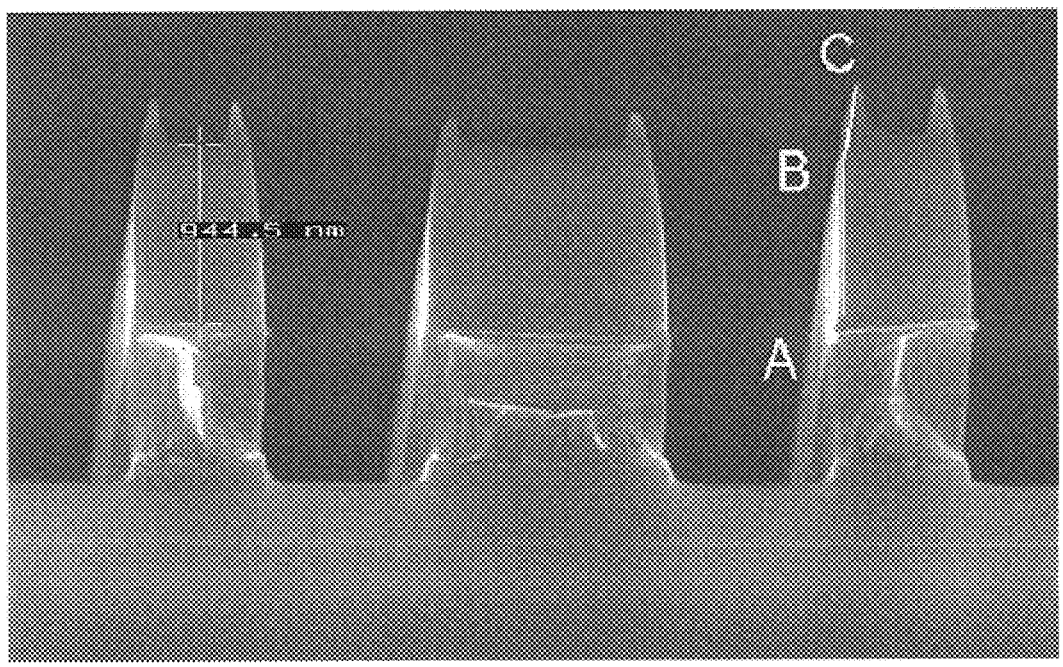
FIGS. 4a and 4b are respective photographs at the electron microscope showing a detail of a semiconductor device, as formed on a semiconductor material wafer processed according to a first embodiment of this invention.
Figure 4B:
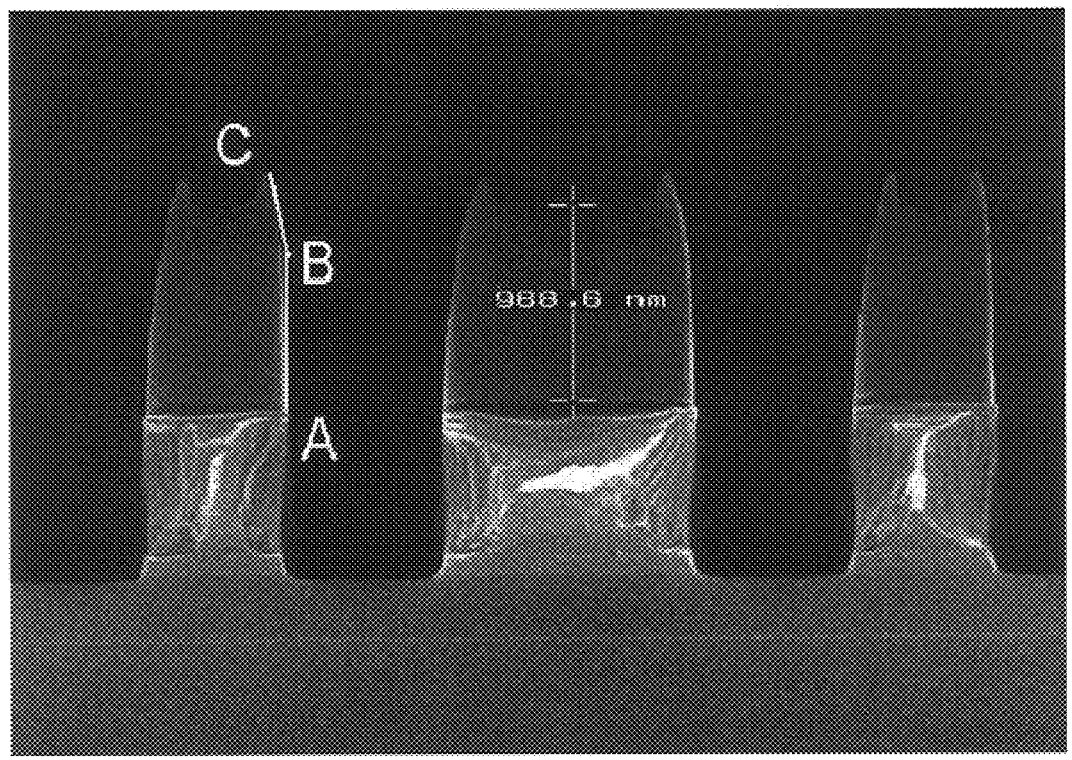

The examples shown in FIGS. 4a and 4b will now be considered. In either of the examples shown in these Figures, the wafer of semiconductor material whereon the electronic device is to be formed has been processed in accordance with embodiments of this invention.

Basically, the semiconductor wafer has been radiated with an ion beam generated by an ion implant device as is normally employed for implanting dopant in predetermined regions of the semiconductor.

Advantageously, an arsenic ion beam was used and implanted at an implant energy of 60 KeV, a dosage of $2*10^{15}$ atoms/cm$^2$, and a current of 6A.

The example of FIG. 4b differs from the example of FIG. 4a by that argon gas has been used instead.

The wafers of semiconductor material have been plasma etched in quite the same manner as the wafers of FIGS. 3a and 3b.

It will readily be appreciated from this photographic evidence that an increase has occurred in selectivity compared to the prior art example.

In particular, the length of the straight photoresist segment a-b, following the plasma etching step, has been increased by approximately 9500 angstroms.

It is also interesting to observe that there occur no constrictions in the side dimensions of the photoresist, since the cross-sectional width of the aluminum track in FIGS. 4a and 4b is the same as that in FIGS. 3a and 3b.

This unexpected phenomenon can be explained by the occurrence of a synergetic effect between an increase in selectivity brought about by the cross-links, same as with photostabilization, and a new mechanism originating from physical sputtering of the layer 12 being etched by the ions of the implanting beam.

Briefly, the material in ion form is re-deposited onto the walls of the photoresist, thereby modifying the chemiophysical characteristics of the surface and enhancing the capability of the photoresist to withstand plasma etch processing.

Thus, the method effectively improves selectivity in etching processes, between a layer to be etched and a layer of light-sensitive material. And the method can be implemented without using any special equipment: in fact, the ion radiation can be provided by ion implant devices already installed on the production lines for semiconductor devices.

A second embodiment of the invention will now be described.

This modified embodiment provides for exposing the wafer of semiconductor material to a non-reactive gas medium under plasma. Here again, the exposure is effected subsequently to depositing the layer 12 to be etched and defining a circuit pattern on the film 13 of light-sensitive material.

In addition, the gas under plasma is a chemically non-reactive or inert noble gas, such as argon.

This second embodiment has a major advantage in that it can be implemented on the same apparatus as is employed for the plasma etching step.

For example, it will be sufficient to arrange for the plasma etching apparatus to include a device for admitting and dispensing the noble gas employed.

In this second embodiment, the exposing step can be carried out before the reactive etch gases are introduced into the plasma etching apparatus.

This second embodiment removes the need for an additional process step. Also, the treatment duration is quite short, and can be reduced to no more than 20 seconds. This is of great interest from the standpoint of the equipment output rate.

Figure 5:
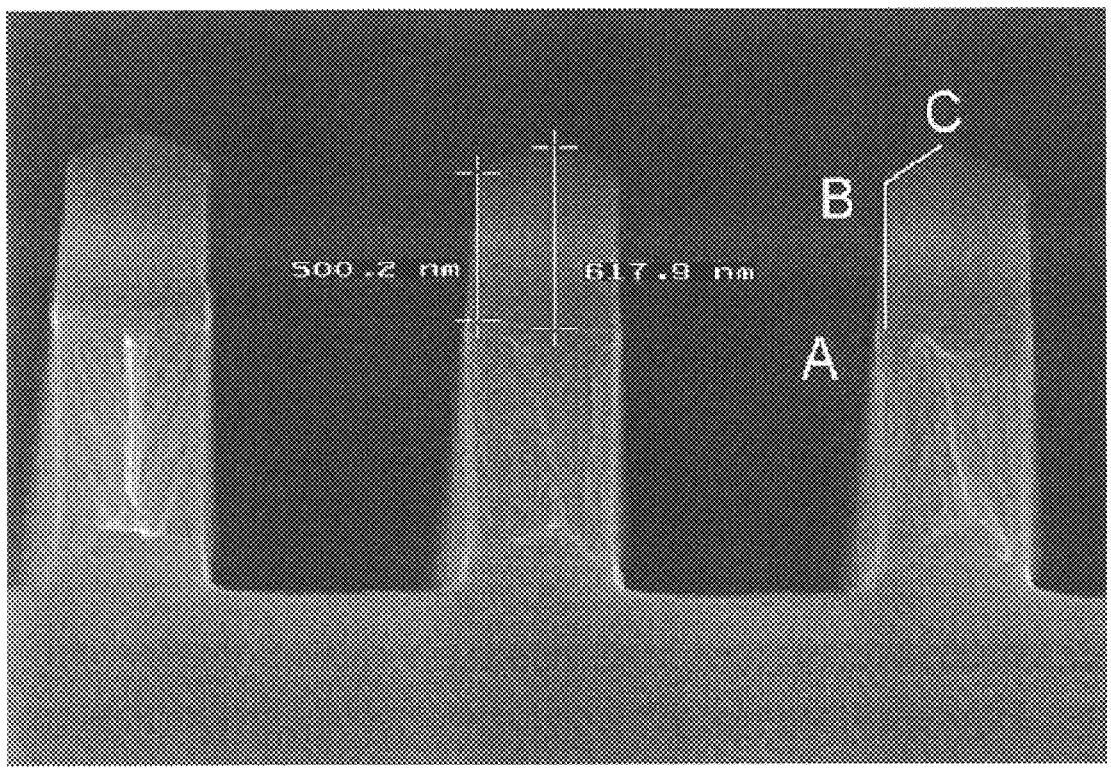
FIG. 5 is a photograph at the electron microscope showing a detail of a semiconductor device, as formed on a semiconductor material wafer processed according to a second embodiment of the invention.

As an example, FIG. 5 shows a cross-section through an aluminum, track after the plasma etching step; also shown is the layer of photoresist which has been left over. The semiconductor material wafer, once placed inside the etching chamber of the apparatus, in this specific case an apparatus known by its trade name Lam TCP 9600, was exposed to an argon plasma for 20 seconds.

The operating conditions were: pressure, 15 mTorr; an argon 100 sccm flow; power of lower electrode, 750 W. Subsequent to this, the reactive gases ($CL_2$, $BCL_2$) were admitted into the etching chamber and the etching process was continued in the standard manner. A comparison with FIG. 3b brings out, here again, the improvement achieved, since the thickness indicated by the segment a-b now jumps, from 2200 angstroms for the untreated wafer, up to 5000 angstroms for the wafer that has been exposed to the plasma. The cross-sectional width of the aluminum track remains unchanged also in this case.

The phenomenon responsible for the increased selectivity is likely to be similar to that of the previous embodiment using radiation with an ion beam. In practice, it is believed that a synergetic effect occurs between the cross links and the photoresist re-sputtering.

It has been ascertained, moreover, that where even a small amount of chemically reactive gas to the layer to be etched is introduced, the effectiveness of the technique is lost.

Specifically, an addition of 10% boron trichloride to the argon flow has proved adequate to provide results similar to those in FIG. 3b.

To quantify the impact of this methodology on the output of the etching machine, the instance of a machine having an output rate of 15 wafers/hour can be considered. An added treatment lasting a bare 20 seconds would bring the output down to 13.9 wafers/hour, which corresponds to an acceptable 7% loss.

In conclusion, it can be said that this modification of the method according to the invention has a major advantage in that it involves no further process steps and has minimal effects on the plasma etching machine output. Furthermore, by having etching processes available which are more selective, the thickness of the photoresist can be reduced, thereby to minimize photolithographic edge effects and ultimately obtain a higher yield.

From the foregoing it will be appreciated that, although specific, embodiments of the invention have been described herein for purposes of illustration, various modifications may be made without deviating from the spirit and scope of the invention. Accordingly, the invention is not limited except as by the appended claims.

What is claimed is:

1. A method for enhancing selectivity between a film of a light-sensitive material and a layer to be subjected to plasma etching in the course of fabrication processes of an electronic semiconductor device starting from a semiconductor material wafer, the method comprising exposing the wafer to a non-reactive gas medium under plasma prior to a plasma etching step and for a period of no more than 20 seconds.

2. A method according to claim 1, wherein the exposing step is carried out subsequently to depositing said layer to be etched and defining a circuit pattern on the film of light-sensitive material.

3. A method according to claim 1, wherein said gas under plasma is noble gas.

4. A method according to claim 1, wherein the exposing step is carried out on an apparatus for carrying out said plasma etching step.

5. A method according to claim 4, wherein said apparatus is equipped with a device for admitting and/or dispensing an inert gas.

6. A method for enhancing selectivity between a film of a light-sensitive material and a layer to be subjected to plasma etching in the course of a fabrication process of an electronic semiconductor device formed on a semiconductor material wafer, the method comprising exposing the wafer to a non-reactive gas medium under plasma prior to a plasma etching step under a pressure of 15 mTorr, an argon flow of 100 sccm, and a power of lower electrode of 750 W.

7. A method for enhancing selectivity between a film of a light-sensitive material and a layer to be subjected to plasma etching in the course of a fabrication process of an electronic semiconductor device formed on a semiconductor material wafer, the method comprising exposing the wafer to a non-reactive gas medium under plasma prior to a plasma etching step under a pressure of 15 mTorr, an argon flow of 100 sccm, and a power of lower electrode of 750 W for a period of no more than 20 seconds.

8. A method for enhancing selectivity between a film of a light-sensitive material and a layer to be subjected to plasma etching on a semiconductor material wafer in the course of fabricating an electronic semiconductor device, the method comprising exposing the wafer to a non-reactive gas medium under plasma prior to a plasma etching step for a period of no more than 20 seconds in a plasma etching chamber subsequent to depositing the layer to be etched.

* * * * *